(12) United States Patent  
Kropp

(10) Patent No.: US 6,312,624 B1  
(45) Date of Patent: Nov. 6, 2001

(54) METHOD FOR PRODUCING AN ELECTROOPTICAL MODULE

(75) Inventor: Jörg-Reinhardt Kropp, Berlin (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/390,167

(22) Filed: Sep. 7, 1999

Related U.S. Application Data

(63) Continuation of application No. PCT/DE98/00631, filed on Mar. 3, 1998.

(30) Foreign Application Priority Data

Mar. 7, 1997 (DE) .............................................. 197 11 138

(51) Int. Cl.[7] .................................................. B29D 11/00
(52) U.S. Cl. ................................... 264/1.25; 264/272.14; 264/272.15; 264/275
(58) Field of Search .................................. 264/1.1, 1.25, 264/263, 272.14, 272.15, 275, 279

(56) References Cited

U.S. PATENT DOCUMENTS 3,810,300 * 5/1974 Hulmes et al. .  
4,410,469 * 10/1983 Katagiri et al. ..................... 264/1.25  
5,275,765 * 1/1994 Go et al. ............................. 264/1.25  
5,355,018 * 10/1994 Fierkens .

FOREIGN PATENT DOCUMENTS

0053482A2    6/1982    (EP) .

OTHER PUBLICATIONS

"An expensive passive method of aligning fibers to laser or photodetector arrays", Christopher K. Y. Chun et al., Technical Developments, Motrolla, Nov. 1996, pp. 152–155.

* cited by examiner

*Primary Examiner*—Mathieu D. Vargot  
(74) *Attorney, Agent, or Firm*—Herbert Lerner; Laurence A. Greenberg; Werner H. Stemer

(57) ABSTRACT

A substrate is precisely positioned by a positioning element belonging to the substrate in an assembly device. While positioned in the assembly device, a converter is disposed and fixed on the substrate in a precise position relative to the positioning element. After that, the substrate is positioned precisely in an injection mold by the positioning element and surrounded by a moldable material, causing the formation of a molded body. The molded body has at least one functional surface, such as a lens or a stop face, serving the purpose of optical coupling.

3 Claims, 2 Drawing Sheets

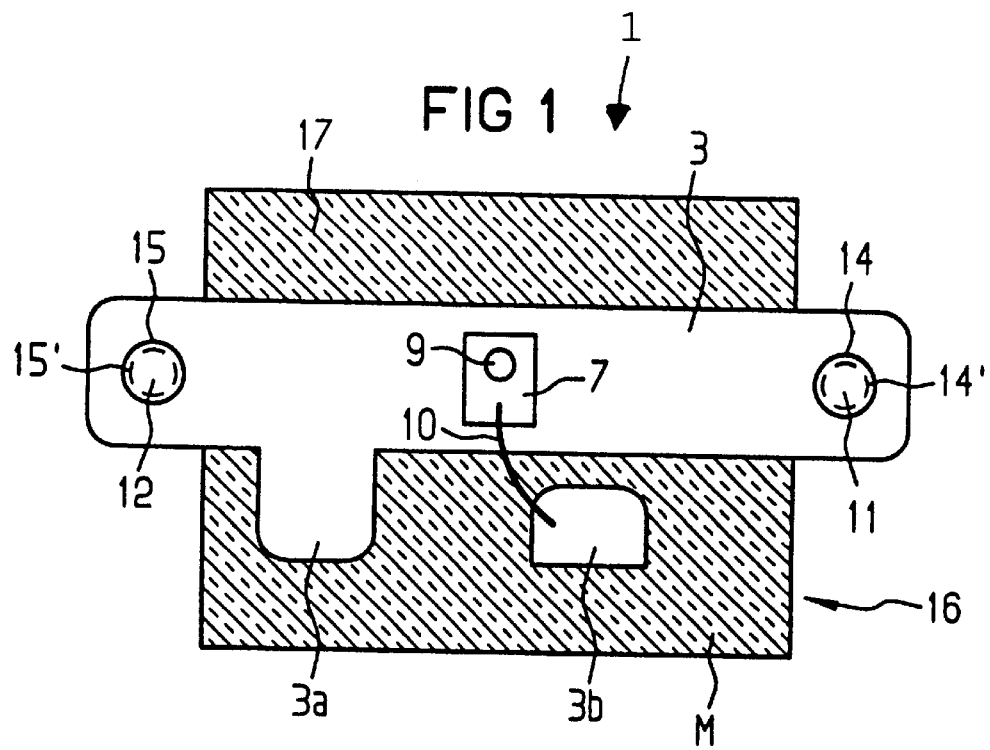
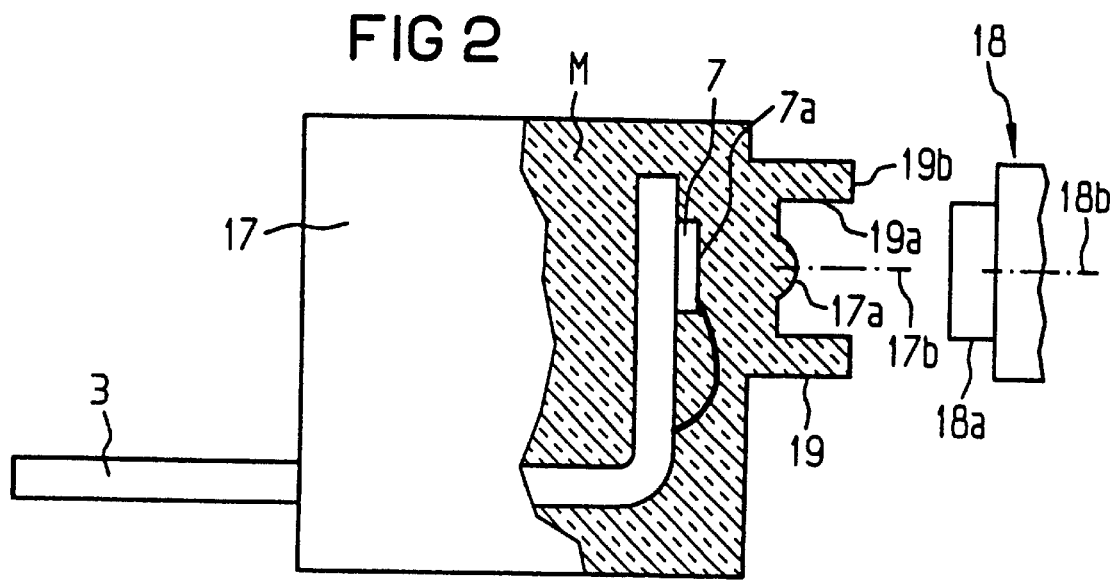

METHOD FOR PRODUCING AN ELECTROOPTICAL MODULE

CROSS-REFERENCE TO RELATED APPLICATION

This is a continuation of copending International Application PCT/DE98/00631, filed Mar. 3, 1998, which designated the United States.

BACKGROUND OF THE INVENTION

Field of the Invention

The field of the invention is the production of electrooptical components or modules, which typically have a receptacle, also called a plug-in bay, for the connection and optical coupling of suitable coupling partners, such as optical lines. As the coupling partners, other optical or electrooptical elements, for instance for the sake of galvanic separations, a further electrooptical module as well, are also conceivable. For converting electrical signals into optical signals, or for converting optical signals into electrical signals, such modules have electrooptical converters, which have a light-projecting region (transmitter) or light-sensitive region (receiver) that in the context of the present invention can also be called optically active zones. For high coupling efficiency when optical signals are fed into wave guides or output from them, not only the electrooptical transformation of the signals but also a precise coupling of the signal-diverting and/or signal delivering optical wave guide (coupling partner) are necessary. As the transmitter, in optical transmission technology, light-emitting diodes (LEDs) or horizontal-beam laser diodes are for instance employed. Because of their construction, such diodes often have a high aperture number, which for high-efficiency optical coupling requires the use of lenses.

The invention relates to a method for producing an electrooptical module in which the electrooptical converter is disposed in a predetermined position on a substrate, and in which the substrate together with the converter is at least partly embedded in a molded body of a moldable material, and the molded body has at least one functional surface serving the purpose of coupling with a coupling partner.

One such production method is known from Published, European Patent Application EP 0 053 482 A2. In the known production method, a substrate (lead frame) of the desired shape is stamped out from a metal sheet (such as a copper foil) first and then gold-coated. Next, the converter (in the case of a transmitter, a laser diode, for instance, or in the case of a receiver, a photo diode) is mounted on the substrate and contacted by way of bond wires and conductive paste for the sake of electrical triggering or signal connection. Next, the substrate together with the converter and optionally other trigger circuits are placed in half shells, which form an injection mold of the desired contour. A suitable transparent, heat-curable resin is placed in the injection mold, and under temperature and pressure, a molded body that imbeds the converter is created. The molded body has at least one functional surface of a predetermined contour serving the purpose of coupling with a coupling partner. The functional surface may for instance be a convex face of a lens serving to shape the beam between the converter and an optical wave guide to be coupled. However, the functional surface may instead or in addition be embodied as a stop face or alignment face for the coupling partner (such as an optical wave guide plug). The molded body is then placed in a housing with mechanical locking elements for the coupling partner.

The known production method includes two especially critical production steps namely, positioning the converter on the substrate, and positioning the substrate in the injection mold, on whose precision the coupling and outcoupling efficiency attainable with the electrooptical module depends. The Published, European Patent Application EP 0 053 482 A2 provides no further teachings in this respect.

SUMMARY OF THE INVENTION

It is accordingly an object of the invention to provide a method for producing an electrooptical module that overcomes the above-mentioned disadvantages of the prior art methods of this general type, which with regard to the position of the electrooptical converter or its optically active zone assures an extremely precise disposition or embodiment of the functional surface in a reliably replicable manner.

With the foregoing and other objects in view there is provided, in accordance with the invention, a method for producing an electrooptical module, which includes:

providing a substrate having at least one positioning element formed therein;

precisely positioning the substrate via the at least one positioning element in an assembly device;

disposing and fixing an electrooptical converter on the substrate in a precise position relative to the at least one positioning element;

positioning precisely and subsequently the substrate together with the electrooptical converter in an injection mold using the at least one positioning element; and injecting a moldable material into the injection mold forming a molded body having at least one functional surface serving for coupling with a coupling partner, the molded body embedding and surrounding, at least partly, the substrate together with the electrooptical converter.

In the production method of the type defined at the outset, the object is attained according to the invention in that the substrate is provided with at least one positioning element. The substrate is precisely positioned by the positioning element in an assembly device, in which the converter is disposed and fixed on the substrate in a precise relative position to the positioning element. The substrate is subsequently positioned precisely by the positioning element in an injection mold and surrounded by the moldable material, thereby forming the molded body and the functional surface.

One substantial advantage of the production method of the invention is that by using simple parts and production techniques, an economical configuration with an extremely precise relative position of the electrooptical converter to the functional surface is assured. Since all the production steps that are critical in this respect refer to the same reference mark or marks—namely, the one or more positioning elements—an extremely precise relative alignment of the converter and the functional surface always exists, regardless of the precision for instance of the production of the outer contour of the substrate. As already noted, the functional surface may for instance be a lens surface or a stop face; however, the type of functional surface is not limited to this but can for instance instead be embodied as a mirror surface. The positioning element may advantageously be embodied as a recess or a protrusion. In principle, all structural and/or geometrical elements suitable for a replicable, positionally accurate positioning of the substrate can be employed in the context of the present invention.

Especially preferably, a plurality of positioning elements are provided on or in the substrate.

A feature of the method of the invention that is especially preferred in this respect provides that the substrate is provided with two circular recesses as its positioning elements.

Other features which are considered as characteristic for the invention are set forth in the appended claims.

Although the invention is illustrated and described herein as embodied in a method for producing an electrooptical module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view of a first module according to the invention;

FIG. 2 is a longitudinal, sectional view of the first module;

DESCRIPTION OF THE PREFERRED EMBODIMENTS

Figure 3:
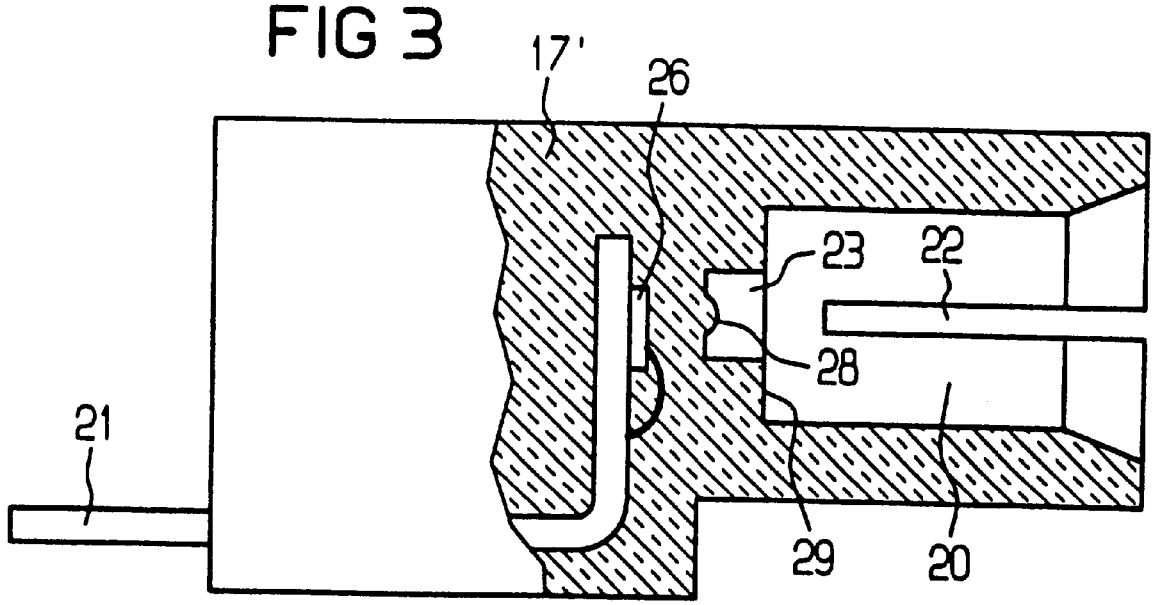
FIG. 3 is a partial, sectional view of a second embodiment of the first module.

In all the figures of the drawing, sub-features and integral parts that correspond to one another bear the same reference symbol in each case. Referring now to the figures of the drawing in detail and first, particularly, to FIG. 1 thereof, there is shown in cross-section a module 1 with a substrate (lead frame) 3, which has a plurality of outward-leading terminal contacts 3a, 3b for external electrical contacting of the module 1. An electrooptical converter 7 is disposed on the substrate 3 and is electrically conductively joined to the substrate 3 by a conductive paste or solder 9. Via a bonding wire 10, a further terminal of the converter 7 is electrically conductively connected to the outer contact 3b.

In order to position the converter 7 exactly on the substrate 3, according to the method of the invention the substrate 3 is placed in an assembly device. For precise positioning of the substrate 3 with respect to the assembly device, recesses of the substrate 3 are used, in the form of two circular bores 11, 12 on respective lateral ends of the substrate 3. For the positioning, the recesses 11, 12, as shown only in suggested form in FIG. 1 for the sake of simplicity, are pierced in form-locking fashion by positioning pegs 14, 15 of the assembly device. This enables extremely precise deposition of the converter 7 relative to the substrate 3, and the converter 7 is then joined via the solder 9. Alternatively, the converter 7 can also be fixed by adhesive bonding, for instance. A positional accuracy of less than 10 μm relative to the recesses 11, 12 of the substrate 3 is attainable using commercially available high-position placement devices. After the ensuing wire bonding, already shown in FIG. 1, the substrate 3 is placed in an injection mold 16, shown only in suggested form here, which in a correspondingly precise configuration also has positioning pegs 14', 15', so that the substrate 3 is repositioned, again extremely precisely, this time with regard to the injection mold 16. In the ensuing process of injection molding using a moldable material M, a molded body 17 already shown in FIG. 1, in which the converter 7 is embedded, is created. The contacts 3a, 3b emerged to the outside for contacting purposes through the molded body 17.

A decisive aspect of the production method of the invention is accordingly that for both method steps, that is, both the converter positioning and the ensuing at least partial embedding of the substrate 3 and the converter 7 in the molded body 17 formed by injection molding, the same positioning elements 11, 12, or at least positioning elements embodied with high precision to one another are used. It is thereby assured that the position of the converter 7 is oriented with maximal precision to the injection mold 16 and thus to the functional surfaces created by the injection mold.

As the fragmentary longitudinal section of the module in FIG. 2 shows, special outer contours of the molded body 17 are formed, depending on the injection mold 16. In detail, a lens 17a is formed, which in a highly precise alignment is opposite an optically active zone 7a of the converter 7. As a result, in the case of an optical transmitter, radiation emitted by the converter 7 is transmitted exactly along axis 17b of the lens 17a, and thus is shaped virtually without error, in the desired way, for coupling into a coupling partner 18, suggested here in the form of an end of an optical wave guide 18b received by a plug prong 18a. The molded body 17 also has a plug-in bay 19, whose inside face 19a is again embodied with maximal precision relative to the optically active zone 7a, for the sake of aligning the coupling partner (such as the plug prong 18a) and/or a coupling device to be connected. A face end 19b of the bay 19 may serve as a high-precision and spaced-apart stop face relative to the lens 17a and the zone 7a.

In FIG. 3, a variant of the module shown in FIGS. 1 and 2 is shown, which differs essentially in having a receiving sleeve 20, embodied integrally with a molded body 17', for a coupling partner in the form of a plug prong, known per se, with an optical wave guide end that is retained in a central bore. The sleeve 20 has a slit 22 for the resilient reception of the plug prong. On the inside, a stop end face 29 is formed in a precise alignment with a converter 26 and a lens 28, the lens being formed as described above. The converter 26 is provided in the manner described above via electrical terminal contacts (such as contacts 21) for electrical triggering or (in the case of a receiver) for picking up the electrical signals.

Figure 4:
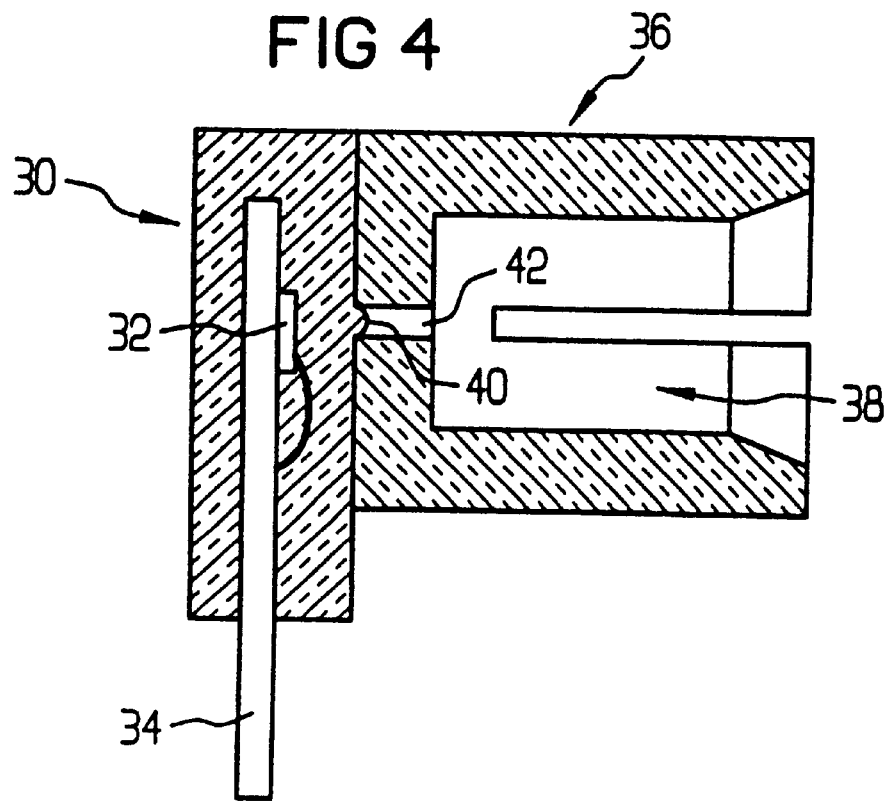
FIG. 4 is a sectional view of a third embodiment of the invention.

In the variant shown in FIG. 4, the module includes a main module body 30 with a converter 32 and terminal contacts 34 as well as a module part 36 that can be manufactured and mounted separately and is configured as a receptacle. As shown in FIG. 4, the module part 36 has a receiving sleeve 38 for an optical wave guide plug prong. Through a bore 42, both a passage of light between the sleeve region and the converter 32 and a precise alignment with the functional surface in the form of a lens 40, which as described above is embodied with high precision with respect to the optically active face of the converter 32, are assured. The form lock of the lens 40 with the through bore 42 brings about a high-precision alignment of the coupling partner relative to the converter 32. Here a functional surface of the lens 40 accordingly has a dual function, acting both as a lens for beam shaping and for aligning the module part 36.

The material forming the molded body 17, 17' or 30 is transparent, at least in a region of the optically active zone of the applicable converter, to the wavelength of the light of the converter or of the system employed. As positioning elements 11, 12 (FIGS. 1 and 2), in addition to the circular recesses shown, differently shaped recesses, protrusions, indentations or markings are also conceivable, as long as the positioning elements perform their assigned function of exact positioning twice, both during the process of assembly with the converter and during the ensuing injection molding process for forming the molded body.

The method of the invention creates a module for optical signal transmission that has a high coupling efficiency. Depending on the connection optical wave guide or coupling partner and converter type, various module fixtures can be made, so that the functional surfaces (or stop or reference faces, lens surfaces, mirror surfaces) can be configured to suit the need and always have a high positional accuracy relative to the converter. The production method allows a very economical configuration that requires very few individual parts; if the converter is fully embedded in the material of the molded body, the converter is reliably protected against external environmental factors.

I claim:

1. A method for producing an electrooptical module, which comprises:

providing a substrate having at least one positioning element formed therein;

precisely positioning the substrate via the at least one positioning element in an assembly device;

disposing and fixing an electrooptical converter on the substrate in a precise position relative to the at least one positioning element;

positioning precisely and subsequently the substrate together with the electrooptical converter in an injection mold using the at least one positioning element; and injecting a moldable material into the injection mold forming a molded body having at least one functional surface serving for coupling with a coupling partner, the molded body embedding and surrounding, at least partly, the substrate together with the electrooptical converter.

2. The method according to claim 1, which comprises forming two circular recesses in the substrate as the at least one positioning element.

3. The method according to claim 1, which comprises forming the functional surface to provide an opening for receiving the coupling partner.

* * * * *